(12) United States Patent
Lueckehe

(10) Patent No.: US 6,742,672 B1
(45) Date of Patent: Jun. 1, 2004

(54) DEVICE FOR DELIVERING ELECTRONIC COMPONENTS

(75) Inventor: Hans-Werner Lueckehe, Salzkotten (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/088,115

(22) PCT Filed: Sep. 13, 2000

(86) PCT No.: PCT/DE00/03177

§ 371 (c)(1),
(2), (4) Date: Mar. 15, 2002

(87) PCT Pub. No.: WO01/20964

PCT Pub. Date: Mar. 22, 2001

(30) Foreign Application Priority Data

Sep. 15, 1999 (DE) .......................................... 199 44 290

(51) Int. Cl.[7] ................................................. G07F 11/00
(52) U.S. Cl. ............................................ 221/13; 29/809
(58) Field of Search ................................ 221/9, 10, 13, 221/22, 289, 163, 194, 171; 29/729, 809, 822

(56) References Cited

U.S. PATENT DOCUMENTS

| 4,099,325 | A | | 7/1978 | Baker |
|---|---|---|---|---|
| 4,293,998 | A | | 10/1981 | Kawa et al. |
| 4,567,652 | A | * | 2/1986 | Gussman et al. ............. 29/837 |
| 4,993,588 | A | * | 2/1991 | Willberg et al. ............... 221/13 |
| 5,553,376 | A | | 9/1996 | Solanki |

FOREIGN PATENT DOCUMENTS

| DE | 3820540 | 12/1989 |
|---|---|---|
| DE | 196 05 489 | 9/1996 |
| JP | 6-13787 | 1/1994 |
| JP | 7-38291 | 2/1995 |
| JP | 10-145089 | 5/1998 |
| JP | 10-335888 | 12/1998 |
| KR | 1994-11489 U | 5/1994 |

* cited by examiner

Primary Examiner—Kenneth W. Noland
(74) Attorney, Agent, or Firm—Staas & Halsey LLP

(57) ABSTRACT

The invention relates to a device for delivering electronic components, in particular SMD components, to an insertion unit. The electronic components are kept ready in the form of a bar unit. A control unit interacts with an actuating unit in each case arranged on delivery rails of a delivery unit, so that the assignment of the bar unit to a predefined delivery rail is made possible, by the actuating unit being brought into a locked position in which the delivery rail is blocked or into an unlocked position in which the delivery rail is released.

15 Claims, 2 Drawing Sheets

DEVICE FOR DELIVERING ELECTRONIC COMPONENTS

CROSS REFERENCE TO RELATED APPLICATIONS

This application is based on and hereby claims priority to German Application No. 19944290.8 filed on Sep. 15, 1999, the contents of which are hereby incorporated by reference.

BACKGROUND OF THE INVENTION

1. Field of the Invention

The invention relates to a device for delivering electronic components, in particular SMD components, to an insertion unit, a bar unit formed from a plurality of components being provided to a delivery unit having a plurality of delivery rails.

2. Description of the Related Art

In order to produce electronic circuits, insertion units are known, in which circuit carriers are fitted with electronic components. The electronic components are usually kept ready as a unit. In particular, high-value components, such as integrated circuits, plugs, etc., are delivered to the insertion unit as a bar unit. For the purpose of setting up the insertion unit, the bar units are usually kept ready in a delivery unit of a mobile change table. The delivery unit has a plurality of delivery rails, which are assigned to corresponding delivery lines of the insertion unit. Since, in particular during setup, the delivery unit is filled with bar units at a location remote from the insertion unit, if there is inattention on the part of the operator, erroneous assignment of the bar unit to the predefined delivery rail of the delivery unit may occur. This leads to the erroneous population of the circuit carrier in the insertion unit.

SUMMARY OF THE INVENTION

It is therefore an object of the present invention to develop a device for delivering electronic components in such a way that secure and reliable fitting of electronic components is ensured.

In order to achieve this object, the delivery rail is in each case assigned an actuating unit which, depending on delivery control data processed in a control unit, can be brought into a locked position in which the delivery rail is blocked or into an unlocked position in which the delivery rail is released.

The particular advantage of the device according to the invention resides in the fact that setup and refilling errors are reliably avoided. Furthermore, machine stoppages can be reduced or avoided, since the rapid and secure assignment of the bar unit to corresponding delivery rails of a delivery unit is ensured. The basic idea of the invention is to specify a checking mechanism which reliably prevents erroneous manual assignment of the bar units to the respective delivery rails. According to the invention, the delivery unit is assigned a control unit to generate delivery control data, which are transmitted to an actuating unit respectively assigned to a delivery rail. Depending on the content of the delivery control data, the actuating unit is actuated, so that it is brought either into a locked position in which the delivery of the bar unit is blocked or into an unlocked position in which said delivery of the bar unit is released.

According to a development of the invention, the control unit has a way of acquiring and processing component-related data relating to the bar unit or, respectively, fitting-related data containing setup information. By entering the component-related data of a specific bar unit, the delivery rail for the corresponding bar unit can be determined, while taking account of the fitting-related data. As a result of the output of delivery control data, the actuating unit of the corresponding delivery rail is brought into an unlocked position, so that the bar unit can be inserted into an insertion area of the delivery rail.

The component-related data of the bar unit can advantageously be applied to the unit as a bar code marking, so that they can be read into the control unit by a reader unit connected to the control unit. The fact that the component-related data are permanently coupled to the bar unit avoids confusion between the bar units when they are assigned to the delivery rails.

According to a further embodiment of the invention, the component-related data can also be stored in a memory of a chip card, the chip card being permanently connected to a corresponding bar unit via a coupling element. As a result of the design as a chip card, any change to the component-related data can be made in an electronically simple way.

According to a preferred embodiment of the invention, the actuating element is designed as an electromagnetic actuating element and has a locking cylinder, which is designed such that it can be displaced transversely with respect to the conveying direction predefined by the delivery rail. By being driven electrically, these can be brought simply into a locked or unlocked position.

According to a development of the invention, the actuating elements are in each case connected via a plug-in connection to a common distributor strip. The distributor strip is preferably connected mechanically and electrically to the control unit. This advantageously results in a modular structure of the device according to the invention, which can easily be mounted on an existing delivery unit.

According to a development of the invention, the actuating element and/or the distributor light-emitting unit, by which, in particular in the case of a large number of delivery rails, the strip have detection of the association by the operator is made easier.

BRIEF DESCRIPTION OF THE DRAWINGS

These and other objects and advantages of the present invention will become more apparent and more readily appreciated from the following description of the preferred embodiment, taken in conjunction with the accompanying drawings of which.

DETAILED DESCRIPTION OF THE PREFERRED EMBODIMENT

Figure 1:
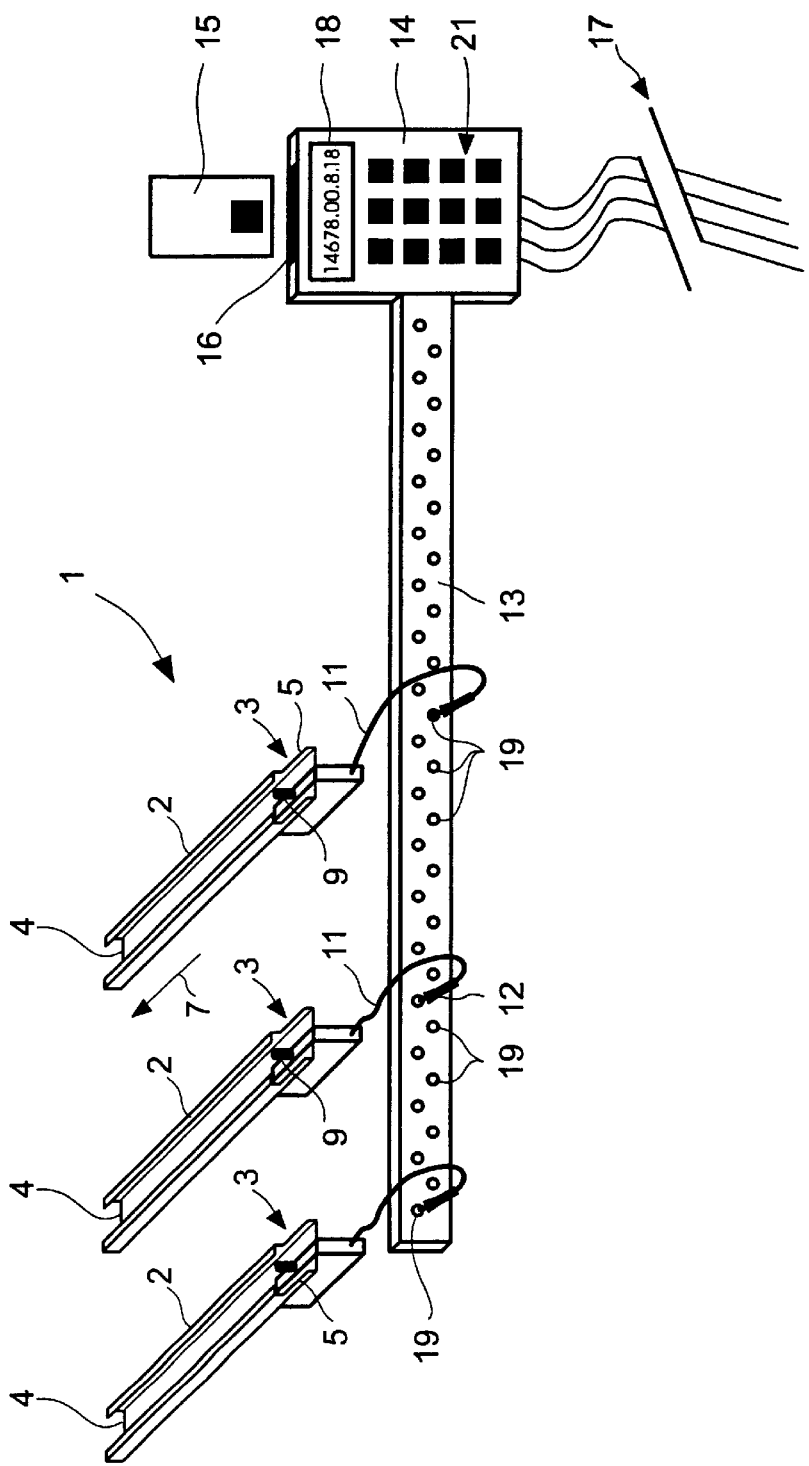
FIG. 1 is a perspective view of a device according to the invention.

Reference will now be made in detail to the preferred embodiments of the present invention, examples of which are illustrated in the accompanying drawings, wherein like reference numerals refer to like elements throughout.

The device according to the invention is used in particular when delivering electronic components as a bar unit. Preferably combined in a bar unit are a plurality of more complex components of one type, such as integrated circuits (IC), BGA components (ball-grid array components) etc. The bar units with these SMD components have to be delivered on a predefined delivery path to an insertion unit (not illustrated) in order to populate a circuit carrier.

A delivery unit illustrated schematically in FIG. 1 is placed on a change table (not illustrated), which is designed such that it can be moved, so that the setting up of the SMD components can be carried out at a location removed from the insertion unit. The delivery unit 1 has a plurality of delivery rails 2, which are each designed as profiles of U-shaped cross section. The delivery rails 2 are arranged parallel to and at a distance from one another. At an end facing away from the insertion unit, the delivery rails 2 each have an insertion area 3, which has side guides 5 projecting only from a base surface 4. In this insertion area 3, bar units 6 are in each case placed manually and brought into a position parallel to the extent of the delivery rail 2, so that the bar unit 6 can be shifted along a delivery path 7 in the delivery rail 2. The bar unit is of box-like design, the cross-sectional contour of the bar unit 6 being designed such that it can be shifted with play within the delivery rail 2.

Figure 2:
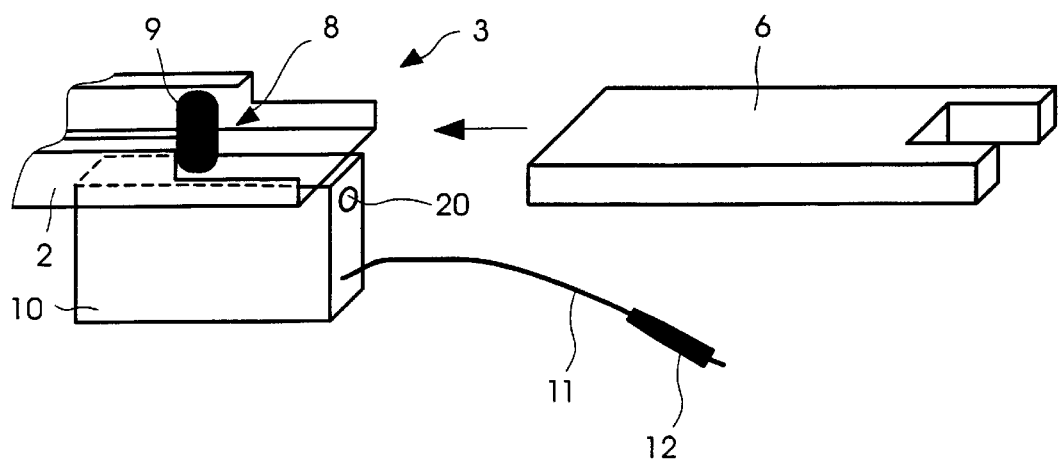
FIG. 2 is an enlarged perspective view of an actuating element in a locked position.

In the insertion area 3, the base surface 4 has a hole 8, with respect to which a locking cylinder 9 is arranged such that it can be adjusted axially. The locking cylinder 9 is a constituent part of an electromagnetic actuating element 10, which is fitted underneath the delivery rail 2 by a fixing unit (not illustrated). A top of the actuating element 10 preferably bears directly on an underside of the base surface 4, see FIG. 2.

The locking cylinder 9 is designed as a reciprocating magnet which, as a result of electrical actuation, can be brought into a locked position in which the delivery rail 2 is blocked and into an unlocked position in which the delivery rail 2 is released. In order to drive the actuating element 10 electrically, the latter is connected electrically and mechanically, by a cable and a plug element 12 adjoining the end of the latter, to a distributor strip 13. The distributor strip 13 extends transversely with respect to the delivery rails 2 in an area which precedes the insertion area 3 of the delivery rails 2. The distributor strip 13 is connected mechanically and electrically to a control unit 14 which is arranged at the side and in which evaluation electronics with a microcontroller and a read-only memory are arranged. Stored in the read-only memory is a comparison program for determining the assignment of the bar unit to one of the delivery rails 2.

Integrated in the control unit 14 is a card reader, by which information stored on a chip card 15 can be read out. The chip card 15 is connected firmly but detachably to a bar unit 6 by a coupling element (not illustrated). The chip card 15 contains component-related data, in particular parts numbers, etc. relating to the components contained in the bar unit 6.

In order to set up the components or refill the same, the chip card 15 connected mechanically to the bar unit 6 is inserted into a slot 16 in the control unit 14, so that the component-related data can be read out and processed in the evaluation electronics. The component-related data are checked in the evaluation electronics of the control unit 14 for agreement with the fitting-related data respectively assigned to the delivery rails 2 for agreement. The fitting-related data contain setup information, which contains statements about an assignment of components to be processed to that one of the respective delivery rails 2 by which the components are delivered to the insertion unit at a predefined location. This setup information therefore depends on the respective insertion unit and can be supplied to the control unit 14 by a data interface 17 by a line control computer. Alternatively, these fitting-related data can also be read in by a further master chip card as a result of it being inserted into the slot 16.

Following the insertion of the chip card 15 having the component-related data, the code for the components of the corresponding bar unit 6 is displayed in a display 18. In this way, the operator is informed about the content of the bar unit 6. By comparing the component-related data with the fitting-related data in the evaluation electronics, delivery control data are generated in the latter and, as delivery control signals, are transmitted sequentially to the distributor strip 13. At the same time, the delivery control signal is output to a plug-in device 19 which corresponds to the delivery rail 2 into which the corresponding bar unit 6 is to be inserted. By this delivery control signal, the corresponding actuating element 10 is actuated in such a way that the locking cylinder 9 is brought out of its blocking initial position into the unlocked position in which the delivery rail 2 is released. The insertion area 3 of the delivery rail 2 is now released, so that the corresponding bar unit 6 can be inserted into the latter by an operator.

In order to make it easier to detect the position of the locking cylinder 9, in each case a light-emitting diode 20 is assigned to the actuating elements 10 and is positioned on a front side of the actuating element 10. When a delivery rail 2 is released, the light-emitting diode 20 lights up and signals to the operator to which delivery rail 2 he is to deliver the bar unit 6. Following the insertion of the bar unit 6, the latter can be uncoupled from the chip card 15. Alternatively, the bar unit 6 can also be uncoupled directly after the chip card 15 has been inserted into the slot 16 in the control unit 14. In addition, a further light-emitting diode can be arranged, which signals the operating state of the actuating element 10. The initial position of the locking cylinder 9 is preferably effected by spring force, so that only an electrical signal to release the delivery rail 2 is required.

According to an alternative embodiment of the invention, the component-related data can also be applied to the bar unit 6 as a bar code marking. By a reading unit integrated into a control unit having the same evaluation electronics as the preceding exemplary embodiment, the component-related data can be read in simply, and can be made available to the evaluation electronics for processing. Following this, the bar unit can be delivered immediately to the corresponding delivery rail 2. This embodiment advantageously permits simplified assignment of the bar unit 6 to the corresponding delivery rails 2.

A keypad 21 with keys is used for the input of service data or the like.

The invention has been described in detail with particular reference to preferred embodiments thereof and examples, but it will be understood that variations and modifications can be effected within the spirit and scope of the invention.

What is claimed is:

1. A device for delivering electronic components, in particular SMD components formed in a bar unit, to an insertion unit, said device comprising:
    a delivery unit with delivery rails;
    actuating units, each assigned to one of the delivery rails; and
    a control unit, coupled to said actuating units, to process delivery control data bringing a respective actuating unit into one of a locked Position in which a corresponding delivery rail is blocked and an unlocked position in which the corresponding delivery rail is released, to acquire and process component-related data relating to the bar unit.

2. The device as claimed in claim 1, wherein said control unit establishes an allocation of the bar unit to a predefined delivery rail, the delivery control data being generated from the comparison between predefined fitting-related data and component-related data in each case assigned to one of the bar units.

3. The device as claimed in claim 2, wherein said control unit can be coupled to a plurality of the delivery rails to transmit the delivery control data sequentially to said actuating units.

4. The device as claimed in claim 3, wherein said control unit comprises evaluation electronics to check the component-related data assigned to the bar unit for agreement with the predefined fitting-related data which is assigned to the delivery rails.

5. The device as claimed in claim 4, wherein said evaluation electronics comprise:

a microcontroller; and a read-only memory storing a comparison program for checking agreement between the component-related data and the predefined fitting-related data.

6. The device as claimed in claim 5, wherein each actuating unit comprises an electromagnetic actuating element.

7. The device as claimed in claim 6, wherein each electronic actuating element includes a locking cylinder arranged to be displaced transversely with respect to an extent of the corresponding delivery rail and placed in an extended position blocking the delivery path on the delivery rail when said actuating element is in the locked position.

8. The device as claimed in claim 7, further comprising an electrical connection to transmit the delivery control data generated by said control unit to each electronic actuating element.

9. The device as claimed in claim 8, wherein said electrical connection comprises a common distributor strip electrically connecting each electronic actuating element to said control unit.

10. The device as claimed in claim 9, wherein each electronic actuating element includes a plug-in element, and wherein said common distributor strip includes plug-in devices corresponding to the delivery rails, each plug-in device being connected to a corresponding plug-in element.

11. The device as claimed in claim 10, wherein said common distributor strip is arranged transversely with respect to the extent the delivery rails at an end of said delivery unit facing away from the insertion unit.

12. The device as claimed in claim 11, wherein at least one of the electronic actuating element and said common distributor strip includes a light-emitting unit to detect the assignment of a relevant bar unit to the corresponding delivery rail.

13. The device as claimed in claim 12, wherein the light-emitting unit includes a light-emitting diode.

14. The device as claimed in claim 13, wherein the component-related data are applied to the bar unit in encoded form as a bar code marking, and wherein said device further comprises a reading unit connected to said control unit to read the bar code marking into said control unit.

15. The device as claimed in claim 13, wherein each bar unit includes a chip cad with a memory storing the component-related data, and wherein said control unit has integrated therein a reading unit to read the component-related data.

* * * * *